(12) United States Patent
King, Jr. et al.

(10) Patent No.: US 10,288,662 B2
(45) Date of Patent: May 14, 2019

(54) SHOCK DETECTOR

(71) Applicants: L. Herbert King, Jr., Chesterfield, MO (US); James Keeven, O'Fallon, MO (US); Frank Vlasaty, St. Louis, MO (US)

(72) Inventors: L. Herbert King, Jr., Chesterfield, MO (US); James Keeven, O'Fallon, MO (US); Frank Vlasaty, St. Louis, MO (US)

(73) Assignee: SHOCK ALERT LLC, O'Fallon, MO (US)

( * ) Notice: Subject to any disclaimer, the term of this patent is extended or adjusted under 35 U.S.C. 154(b) by 223 days.

(21) Appl. No.: 14/999,165

(22) Filed: Apr. 5, 2016

(65) Prior Publication Data

US 2017/0287306 A1     Oct. 5, 2017

(51) Int. Cl.
*G01R 29/12* (2006.01)
*G01R 19/165* (2006.01)
*G01R 19/155* (2006.01)
*G08B 21/08* (2006.01)

(52) U.S. Cl.
CPC ......... *G01R 29/12* (2013.01); *G01R 19/155* (2013.01); *G01R 19/16576* (2013.01); *G08B 21/082* (2013.01)

(58) Field of Classification Search
CPC ............ G01R 19/00; G01R 19/0084; G01R 19/0092; G01R 19/10; G01R 19/145; G01R 19/15; G01R 19/155; G01R 19/165; G01R 19/16566; G01R 19/16576; G01R 19/1659; G01R 27/00; G01R 27/02; G01R 27/08; G01R 27/14; G01R 27/22; G01R 29/00; G01R 29/12; G08B 21/00; G08B 21/02; G08B 21/04; G08B 21/0438; G08B 21/0484; G08B 21/08; G08B 21/082
USPC ............... 324/323, 347, 600, 649, 691, 713
See application file for complete search history.

(56) References Cited

U.S. PATENT DOCUMENTS

| | | | |
|---|---|---|---|
| 378,903 A | 3/1888 | Phelps | |
| 3,384,747 A | 5/1968 | Able | 250/381 |
| 3,510,766 A | 5/1970 | Russell et al. | |
| 3,662,260 A | 5/1972 | Thomas | 324/72 |
| 3,684,872 A | 8/1972 | Clauset et al. | 703/10 |
| 3,778,803 A | 12/1973 | Jahn | 340/539.26 |

(Continued)

FOREIGN PATENT DOCUMENTS

| CN | 2125857 U | 12/1992 |
|---|---|---|
| EP | 2189797 A2 | 11/2008 |

(Continued)

OTHER PUBLICATIONS

Online electronics, Ltd Voltage gradient probe downloaded from http://online-electronics.com/our-products/specials/voltage-gradient-probe/ (see p. 14).

(Continued)

*Primary Examiner* — Hoai-An D. Nguyen
(74) *Attorney, Agent, or Firm* — Johnson & Phung LLC (57) ABSTRACT

A shock detector for determining the existence of a voltage gradient in a body of water, which may be remote from a structure and providing an alarm when the voltage gradient comprises a hazardous electrical condition that could injure or kill are person coming into contact with the body of water.

20 Claims, 5 Drawing Sheets

(56) References Cited

U.S. PATENT DOCUMENTS

| | | | |
|---|---|---|---|
| 3,784,903 A | 1/1974 | Thomas | |
| 3,869,668 A | 3/1975 | Thompson | |
| 4,121,200 A | 10/1978 | Colmenero | 340/539.26 |
| 4,270,307 A | 6/1981 | Arigaya | |
| 4,725,785 A | 2/1988 | Converse et al. | 324/559 |
| 4,747,085 A | 5/1988 | Dunegan et al. | 367/93 |
| 4,755,081 A | 7/1988 | Esparza | 340/566 |
| 4,779,052 A | 10/1988 | Levy et al. | 324/542 |
| 4,864,282 A | 9/1989 | Toeg | |
| 4,918,391 A | 4/1990 | Byrd | 324/446 |
| 5,005,007 A | 4/1991 | Weng | |
| 5,146,208 A | 9/1992 | Parra | |
| 5,202,638 A | 4/1993 | Kolz | |
| 5,289,133 A | 2/1994 | Kolz | 324/444 |
| 5,367,250 A | 11/1994 | Whisenand | 324/133 |
| 5,369,365 A | 11/1994 | Waitman | 324/444 |
| 5,402,298 A | 3/1995 | Gershen | |
| 5,410,246 A | 4/1995 | Cornwall | 324/96 |
| 5,789,911 A | 8/1998 | Brass | 324/72.5 |
| 5,828,304 A | 10/1998 | Mowday | 340/556 |
| 6,021,033 A * | 2/2000 | Benham | F21S 8/00 361/1 |
| 6,133,838 A | 10/2000 | Meniere | 340/573.6 |
| 7,253,642 B2 | 8/2007 | Kalokitis et al. | 324/686 |
| 8,643,360 B1 | 2/2014 | Cargill | |
| 8,686,713 B2 | 4/2014 | Cargill | 324/96 |
| 9,506,957 B1 | 11/2016 | Branstetter et al. | |
| 9,836,943 B1 | 12/2017 | Branstetter et al. | |
| 2004/0080320 A1 | 4/2004 | Golub | |
| 2005/0218902 A1 | 10/2005 | Restaino et al. | |
| 2005/0218914 A1 | 10/2005 | Brabers | 324/694 |
| 2007/0063713 A1 | 3/2007 | Kho et al. | 324/700 |
| 2007/0200715 A1 | 9/2007 | Durand | |
| 2008/0174441 A1 | 7/2008 | Durand | |
| 2008/0191705 A1 | 8/2008 | Bellan | 324/529 |
| 2009/0309604 A1 | 12/2009 | Zhang | |
| 2010/0148788 A1 | 6/2010 | San Martin et al. | |
| 2011/0277488 A1 | 11/2011 | Peretz | |
| 2014/0062512 A1 | 3/2014 | King, Jr. et al. | |
| 2014/0062708 A1 | 3/2014 | Cargill, III | |

FOREIGN PATENT DOCUMENTS

| | | |
|---|---|---|
| JP | H08201146 A | 8/1996 |
| JP | H11241919 A | 9/1999 |
| WO | WO 2010/078617 A1 | 7/2010 |

OTHER PUBLICATIONS

Rifkin Shafer 2008 report downloaded from http://www.qualitymarineservices.net/In%20Water%20Shock%20Hazard%20Final%20Compiled%20-%20with%20author%20sheet.pdf.

http://www.kmbc.com/news/Inventor-s-device-warns-of-lake-electricity-risk/15598478.

http://www.komu.com/news/man-invents-dock-shock-alert-system-/#.UDQB7qEOxQE.facebook.

https://www.facebook.com/Dock-Shock-Alert-474581832560744/?hcref=PAGES TIMELINE.

U.S. Department of Agriculture. Ettects of Electrical Voltage/Current on Farm Animals: How to Detect and Remedy Problems. Beltsville, MD: U.S. Department of Commerce, 1991.

Johnson, Donald. "The Case of Stray Voltage in a Lake." Electrical Construction and Maintenace (2009): pp. 1-5. Website.

http://www.docklifeguard.com.

https://www.facebook.com/474581832560744/videos/3810773824197/?comment id=10206443732628449&comment tracking=%7B%22tn%22%3A%22R%22%7D.

www.midwestboatparty.com/forum/archive/index.php/t-32/33.html.

www.youtube.com/watch?v=sDgRMAw2iBE.

http://www.kmbc.com/image/view/-/15599516/medRes/2/-/maxh/350/maxw/620/-/vnwhpm/-/Inventor-hopes-Dock-Shock-Alert-saves-lives.jpg.

https://youtu.be/shkhmZTTKdY.

https://www.facebook.com/Talkscheap?fref=ts.

https://www.facebook.com/Dock-Shock-Alert-474581832560744/.

Rifkin et al, Freshwater Marina: A Ground Fault Analysis, National Electric Code Internet Connection, Oct. 17, 2002, 4 pages.

http://www.lakeozarkshomes.com/safedocktester.htm.

http://www.docktester.com/use.htm.

Safewater 24-7 docs from SA infringe contentions.

Safewater 24-7 Product Handout.

Safewater 24-7 Product Installation Instructions.

Safewater Additional Webpage.

Shock Alert 2012 Provisional Aug. 28, 2012.

Shock Alert 396 Nonprovisional Aug. 26, 2013.

New Matter DocCompare of 2013 NonPro to 2012 Prov.

396 Patent Original ADS Aug. 26, 2013.

396 Patent Oct. 4, 2013 ADS.

396 Patent Nov. 20, 2015 ADS.

396 Patent Dec. 28, 2015 ADS.

KSmith Facebook Publications Jul. 16, 2009.

KSmith FB Images and video July and early Aug. 2012.

KSmith FB Dock-Shock-Alert pubs Aug. 12, 2012 Sep. 1, 2012.

Photos of KSmith 2009 Installed DSA on Dock—Feb. 2017.

KMBC News Jul. 18, 2012—Inventor's device warns.

KMBC Jul. 18, 2012—Live Newscast Video—KSmith Dock Shock.

KOMU News Article—KS dated Aug. 19, 2012.

Dock LifeGuard User Manual v1.2e.

DLG Email to Ameren dated Jul. 20, 2012.

Ameren response email to DLG dated Jul. 20, 2012.

DLG email to Villages Cove Captains dated Jul. 23, 2012.

DLG Newspaper Advertisement Aug. 31, 2012.

DLG Ad Brochure and Television Ad Placement Sep. 2012.

DLG Email to Villages of the Four Seasons—Sep. 21, 2012.

DLG Email correspondences with Four Seasons—Oct. 2012.

DLG Emails with Ameren Power Company—Dec. 2012.

U.S. Appl. No. 61/696,204, filed Sep. 2, 2012, Cargill.

NPL—The Case of Stray Voltage in a Lake—2009.

NPL—USDA—Electrical Effects on Farm Animals—1991.

NPL—USCG In-Water Shock Hazard Mitigation Oct. 1, 2008.

NPL—EPRI 2010—Elevated Neutral.

NPL Fluke 1998.

NPL—MidwestBoatparty_Online_Forum-Blog Thread Jul. 2012.

NPL—SamsMarine Blog—How do you measure in water—2010.

NPL—Reef_Central_Blog-Multimeter_measure_voltage_water-2008.

SAFW Non-in and invalid Contentions Sep. 1, 2017.

Complaint.

Exhibit A to Complaint.

Answer & Counterclaims.

Pltf Reply to Counterclaims.

\* cited by examiner

SHOCK DETECTOR

CROSS REFERENCE TO RELATED APPLICATIONS

None

STATEMENT REGARDING FEDERALLY SPONSORED RESEARCH OR DEVELOPMENT

None

REFERENCE TO A MICROFICHE APPENDIX

None

BACKGROUND OF THE INVENTION

One of the problems that occurs with an electrical fault in a body of water is that the current leakage into the body of water from the electrical fault can injure or kill a person through electrocution, which is often referred to as electric shock drowning. This invention relates generally to shock detectors and, more specifically, to shock detectors that can be used to prevent electric shock drowning by detecting the presence of an electric field and alerting a person that the body of water comprises a hazard to a swimmer or a person coming into contact with the body of water. Typically, the current leakage occurs from a faulty electrical connection on a boat or dock although other sources may create a hazardous water condition.

It is known that if a swimmer encounters a body of water with an electric field the swimmer can be electrocuted with a voltage gradient of as little as two volts per foot. The mere presence of the swimmer in the electric field causes the current flowing in the water to take a path of least electrical resistance through the swimmers body since the wet skin on a swimmer's body has a lower electrical resistance than the water surrounding the swimmer. If the voltage gradient is sufficiently high the current flowing through the swimmer's body can electrocute the swimmer. In still other cases a person may be electrocuted if he or she comes into incidental contact with a body of water, which has leakage from an electrical source.

In addition to the existence of a harmful voltage gradient in a body of water there is a need to safely locate the source of the harmful voltage gradient as well as to ensure those proximate the body of water that the water does or does not contain a hazardous electrical field.

SUMMARY OF THE INVENTION

An open water shock detector for measuring the existence of a harmful water voltage in a body of water through the measurement of a voltage gradient on a set of water electrodes with the shock detector including a self testing feature to indicate the shock detector is operating properly before full activation of the shock detector so that when the shock detector in an activated condition the shock detector is useable to either alert a person to a harmful water condition or to allow an operate to use the shock detector to isolate the source of an electrical short in the body of water through a displacement of the shock detector in the body of water.

DESCRIPTION OF THE PREFERRED EMBODIMENT

Figure 1:
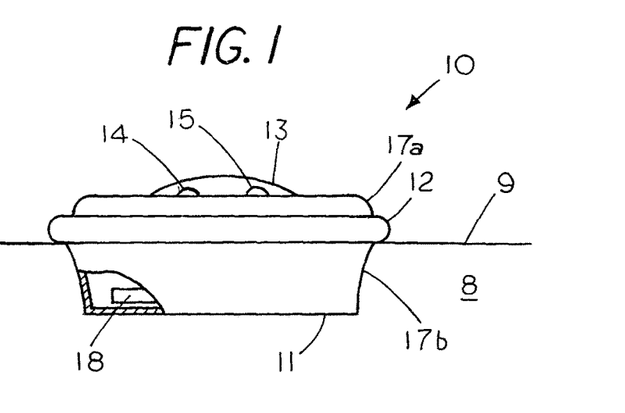
FIG. 1 shows a shock detector floating in a body of water.

FIG. 1 shows a free floating, buoyant, open water shock detector 10 floating upright in a body of water 8 having a water line 9 with the upper housing 17a of shock detector 10 including a resilient bumper 12 located around the outer perimeter of the shock detector. The resilient bumper, which is shown located above the water line 9, protects the shock detector in the event the shock detector accidently bumps into an object while floating in the body of water. In this example, the shock detector 10 includes a transparent or see through hemispherical shaped dome 13 extending from a top housing 17a, with a green LED light 13 and a red LED light 14 that are both visible from afar through the transparent dome 13. The lower housing 17b of shock detector 10, which is below the water line 9, is shown partially cut away to reveal a ballast 18 in the bottom of shock detector 10. A feature of the invention is the use of a ballast in the bottom of the floating shock detector that causes the shock detector 10 to float in the upright condition as shown in FIG. 1 as well as causes the shock detector to right itself in the event the shock detector is accidently flipped upside down as it floats in the body of water. The ballast may either be a dead weight placed in the floating shock detector or it may be strategically placed integral components of the shock detector so that the weight of the strategically placed external and internal shock detector components comprise the necessary ballast for generating a self righting force or torque to the shock detector 10 that is sufficient to return the shock detector to the floating condition as shown in FIG. 1 in the event the shock detector tips over due to an external force such as a wave. A feature of the open water shock detector 10 is that it is ungrounded since it floats in the body of water and measures a voltage gradient within the body of water. A further feature of shock detector 10 is that the shock detector housing and dome are both waterproof and weatherproof, which enables the shock detector to operate while floating in a body of water as well as all types of weather.

Figure 2:
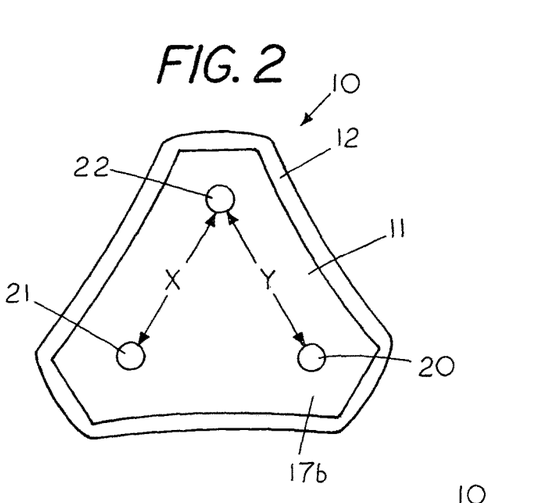
FIG. 2 is a bottom view of the floating shock detector of FIG. 1 revealing a set of three water electrodes.

FIG. 2 is a bottom view of the floating shock detector 10 of FIG. 1, which comprises an ungrounded shock detector since it measures voltages between electrodes located in the body of water without reference to an electrical ground. In this example the shock detector determines the presence of a harmful voltage gradient in the body of water as the shock detector free floats in a body of water. The processor in shock detector 10 measures voltage between a set of spaced apart water electrodes 20, 21 and 22, which are integral to the shock detector, to obtain a voltage difference between the electrodes i.e. a voltage gradient in the body of water and compares to a known voltage gradient that is sufficient to cause injury or death to a person in the body of water. While the shock detector of the invention described herein measures the voltage gradient in the body as it floats in a body of water 8 the shock detector may also be attached to a structure such as a dock and used to measure a voltage difference between a water electrode and an earth ground. In either case the shock detector can determine a hazardous water voltage condition i.e. a voltage gradient within the body of water that could injure or kill a person coming into contact with the body of water.

The voltage gradient, which is referred herein as a water voltage, is based on a measured voltage difference between any of the three electrodes or may be computed based on an average of the measured voltage difference between the three water electrodes. In either event the magnitude of voltage gradient in the body of water is a function of whether the voltage gradient can injure or kill a person that comes into contact with the body of water. In the example shown the shock detector 10 determines if there is a voltage gradient in the body of water that may injure or kill a person that enters the body of water. A feature of the shock detector 10 is that the shock detector can determine the existence of a harmful water voltage gradient in a body of water even though the shock detector is remote from a structure in contact with the body of water. In the example shown the shock detector measures an AC water voltage such as an AC water gradient in the body of water to determine if the water voltage i.e. the AC voltage gradient is such that it would injure or kill a person. In some cases where DC voltages may be present one may measure a DC voltage gradient or in other cases one may measure both AC and DC voltage gradients to determine if the AC or DC water voltage is such that it would injure or kill a person.

FIG. 2 shows the underside 11 of shock detector 10 revealing a set of three circular metal water electrodes located on the bottom side of an ungrounded shock detector 10 that floats in a body of water. The ungrounded shock detector 10 includes, a first water electrode 20, a second water electrode 21 and a third water electrode 22 with the water electrode 21 spaced from the water electrode 22 by the distance x and the water electrode 22 spaced from the water electrode 20 by the distance y with the three electrodes extending through a common plane. In this example the water electrode 20 and water electrode 21 are located along a right angle with the apex located at water electrode 22 and all three water electrodes, which are below the water line, are connected to a processor in shock detector 10 that measures the electric potential between electrodes to obtain the voltage gradient (i.e. volts per foot) in the body of water 8 to determine whether the voltage gradient in the body of water is such that it could cause injury or kill a person who enters the body of water. While a set of three water electrodes allows one to determine the voltage gradient in different directions in the electric field in some applications one may use a set of two water electrodes to determine the voltage gradient in the body of water and in other applications four or more water electrodes may be used to measure the voltage gradients in the body of water.

Figure 3:
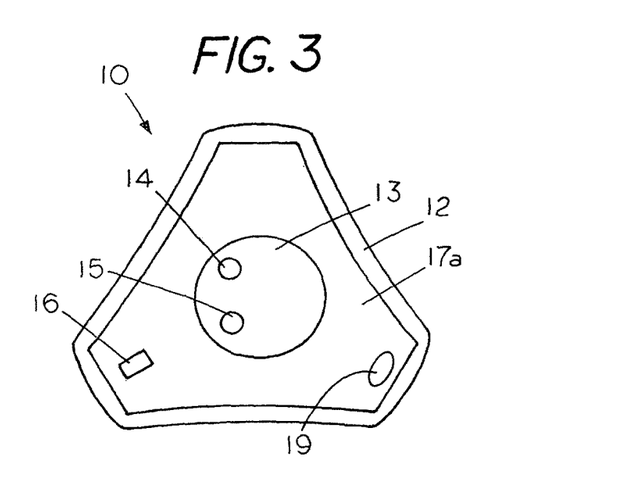
FIG. 3 is a top view of floating shock detector showing the visual and audible alarms.

FIG. 3 is a top view of the floating shock detector 10 showing the central location of the transparent dome 13 with a green LED light 14 and a red LED light 15 visible through the dome 13. The dome provides enhanced visibility since it allows the LED lights to be seen by a person located laterally of the shock detector or a person located above the shock detector. An audible alarm 16 such as a beeper or a buzzer is also located on the top housing 17a of the shock detector. An opening 19 in top housing 17a forms a loop that allows one to insert a cord therethrough so one can attach the cord to the shock detector. The cord allows the shock detector 10 to be tethered in place in a body of water 8 with an anchor or the like. In addition the shock detector may be tethered to a dock or to a boat to alert persons to the existence of a harmful voltage gradient in a range around the floating shock detector. The feature of a tethered floating shock detector is also useful to a boater coming into an unknown dock since the boater can lower the shock detector into the body of water using the cord attached to the shock detector to test for the presence of a harmful electric field in the body of water before stepping out of the boat. A further advantage of a tethered floating shock detector is that when the boat is in open water one can lower the floating shock detector into the water around the boat to determine if there is a harmful electrical field around the boat, which may be caused by an electrical short in the boat wiring. A feature useful in the event persons want to swim from the boat. Thus, the shock detector described herein may be used in water adjacent a land site or in open water to determine if a voltage gradient is present in the water, which is sufficient to injure or kill a person coming into contact with the body of water.

Figure 4:
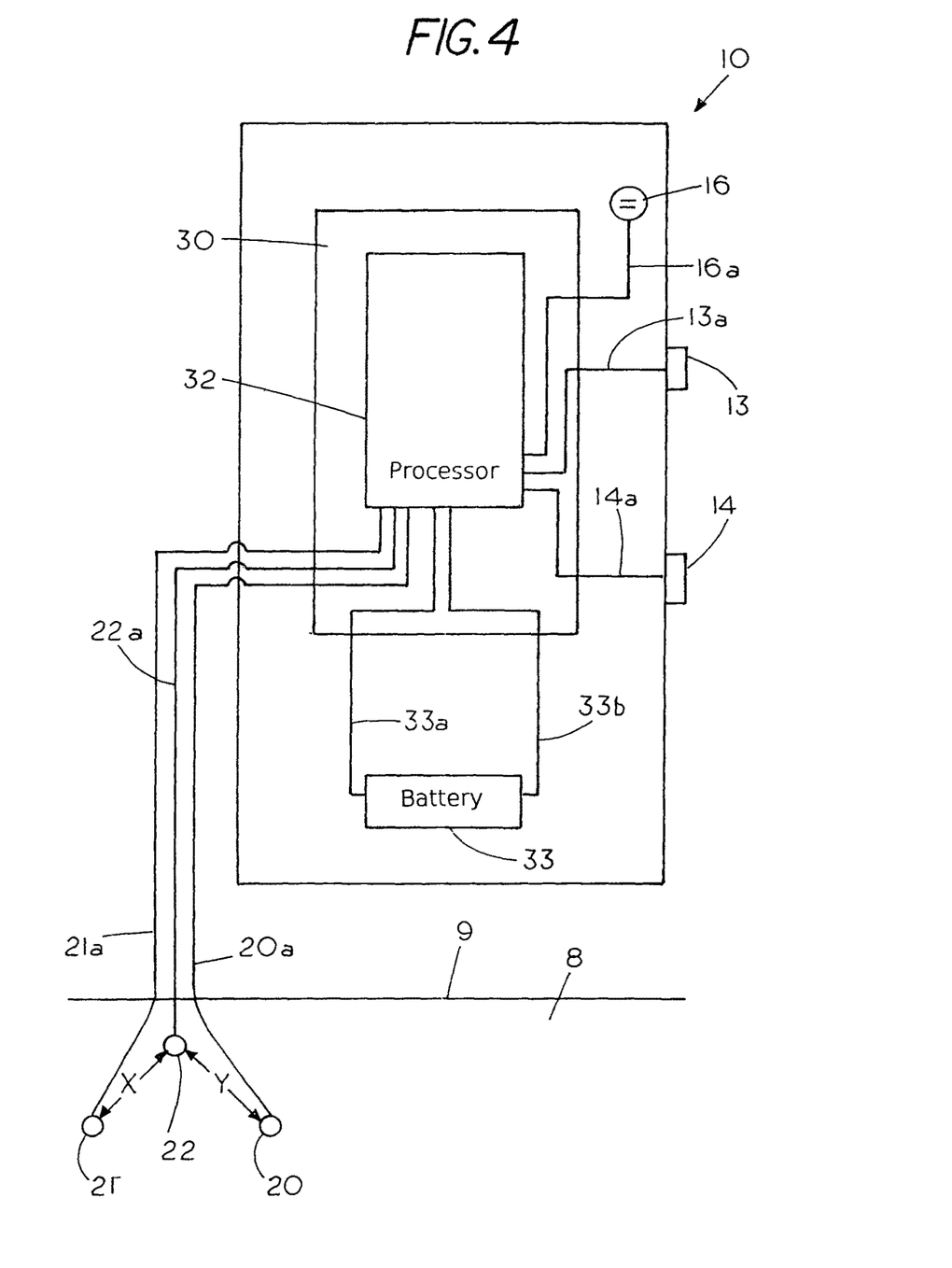
FIG. 4 is a schematic illustrating electronic communications between various components of the shock detector.

FIG. 4 is a schematic illustrating electronic communications between various components of the shock detector 10 and a circuit board 30 containing a processor 32. In this example the audible alarm 16 connects to processor 32 on circuit board 30 through electrical lead 16a. The Red LED light 13 or visual alarm connects to processor 32 on circuit board 30 through electrical lead 13a and similarly the green LED light 14 or visual alarm connects to processor 32 on circuit board 30 through electrical lead 14a.

Located proximate the circuit board 30 is a battery 33 having a first terminal with a lead 33a connected to processor 32 and a second terminal with a lead 33b connected to processor 23. In this example the battery 33 provides power to operate the processor 32 as well as the visual alarms 13,14 and the audible alarm 16.

The set of water electrodes 20, 21 and 22 are shown located in a body of water 8 with an electrical lead 20a, connecting water electrode 20 to processor 32, an electrical lead 21a connecting water electrode 21 to processor 32 and an electrical lead 22a connecting water electrode 22 to processor 32 with all the water electrodes located below the water line 9.

The use of three water electrodes enables measurement of water voltage in the body of water between three different locations. In this example, the shock detector 10 measures the water voltage between three electrodes to obtain a voltage gradient within the body of water.

The voltage gradient in a body of water is generally highest proximate a current leak, which is the source of the electrical failure, and decreases the further away from the source of the electrical failure thus creating a potential field within the body of water that decrease in distance from the source of the electrical failure. In this example the processor 32 determines if the strength of the voltage gradient in the body of water is such that it would kill or injure a person coming into contact with the body of water.

Figure 5:
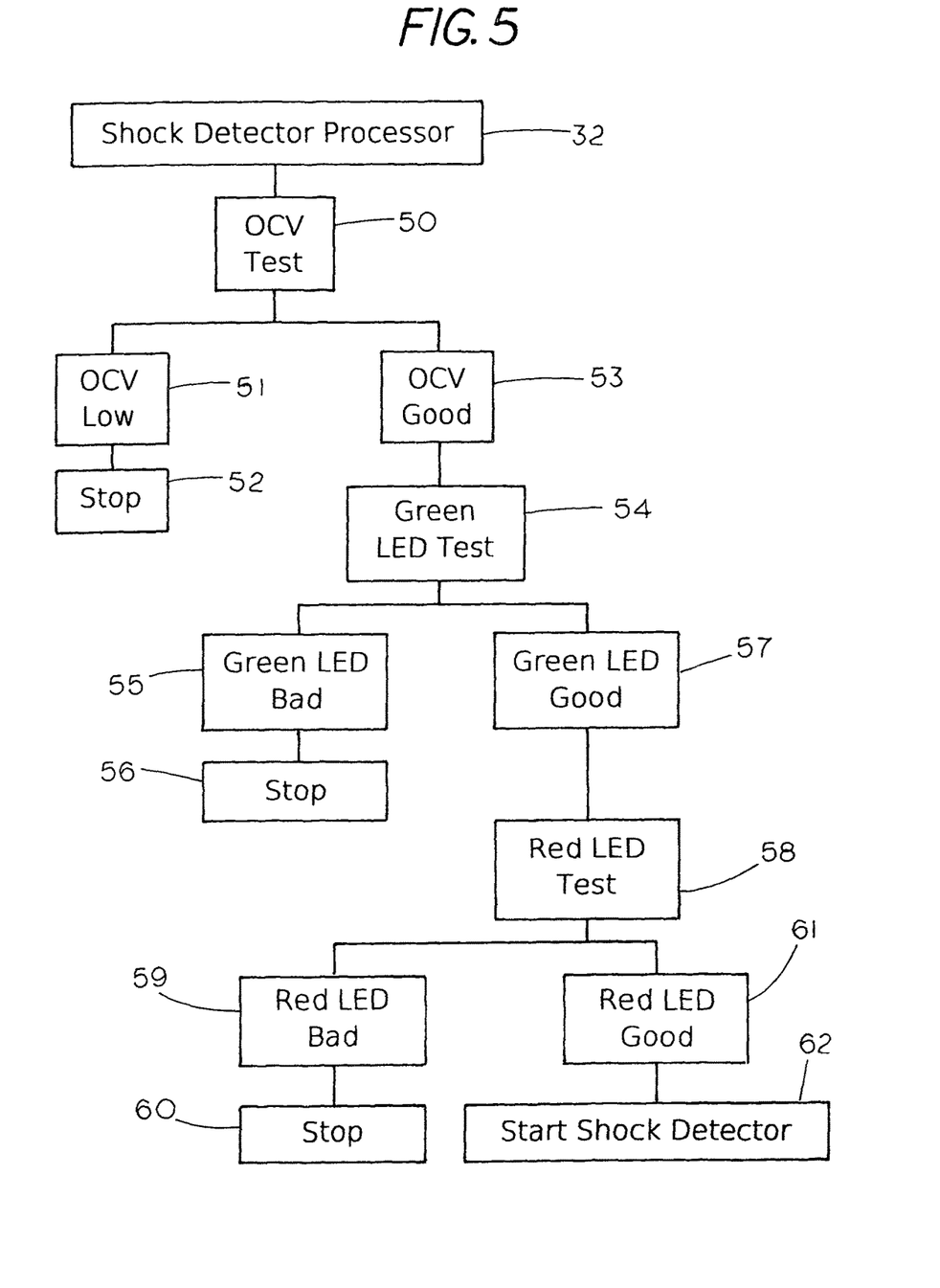
FIG. 5 is a flow chart illustrating the method of self-testing of the shock detector.

A feature of the invention described herein is that before initiating measurements of voltage gradient the shock detector performs a self-test to let a person know the shock detector is operative and ready to be placed in a body of water to determine if the water contains a harmful electrical condition. FIG. 5 shows a flow chart illustrating the method of self-testing of the shock detector 10, which comprises the steps of checking battery voltage under various conditions before the shock detector begins monitoring the voltage gradient in the body of water to determine if a hazardous electrical condition exists i.e. where the voltage gradient is sufficient to deliver an electric shock that can cause injury or death to a person that comes into contact with the body of water.

To initiate the battery self-test the shock detector processor 32 automatically performs a sequence of battery tests under different load conditions. In this example the self-test includes measuring the battery voltage with an open circuit (no load across the terminals of the battery), which is referred to as the open circuit voltage (OCV) test (50) of the battery in the shock detector. If the OCV voltage of the battery is low (51) (i.e. below a preselected voltage threshold) the processor 32 stops the test (52) and prevents the shock detector from start up. If the OCV voltage of the battery is good (53) i.e. above the preset preselected voltage threshold the processor (32) begins the next step by checking the battery voltage under various load conditions. The first test of the battery voltage under load condition is with the green LED light on as illustrated by the green LED test (54). If the battery voltage is below the preselected voltage (i.e. bad) with the green LED on, the processor (32) within the shock detector 10 prevents shock detector start up. On the other hand if the battery voltage with the green LED on is above the preselected voltage (i.e. good) (57) the processor (32) proceeds to the next step in the battery self test cycle where the battery voltage is tested with the red LED on. If the processor determine the battery voltage with the red LED on is bad (59), i.e. below a preselected voltage the processor 32 stops the operation of the shock detector. If the battery voltage of the shock detector is good with the red LED on (61) i.e. above the preselected voltage the processer 32 sends a signal to start the shock detector (62) for measuring the voltage gradient in the body of water. Typically, the cycle for self-test where the battery voltage is measured under different conditions may be repeated after start up to ensure that the battery voltage remains sufficient to measure the voltage gradient and emit an alarm over an extended period of time if the shock detector should detect the presence of harmful voltage gradient or if the battery should be replaced.

A further feature of the invention is that once the shock detector 10 passes the battery self test the shock detector 10 automatically begins monitoring the voltage gradient in a body of water. In operation mode the shock detector 10 provides real time information on the existence of harmful voltage gradient in the body of water, the strength of the voltage gradient in the body of water and the status of the battery in the shock detector through a combination of a red LED light, a green LED light and an audio alarm or beeper. This latter feature of measuring the level or strength of the voltage gradient in the body of water enables shock detector 10 use as a diagnostic tool to determine the location of a voltage leak in the body of water by moving the shock detector in the body of water to find the region in the body of water where the voltage gradient is the highest since the voltage gradient generally decreases with distance from the source of the leak.

Figure 6:
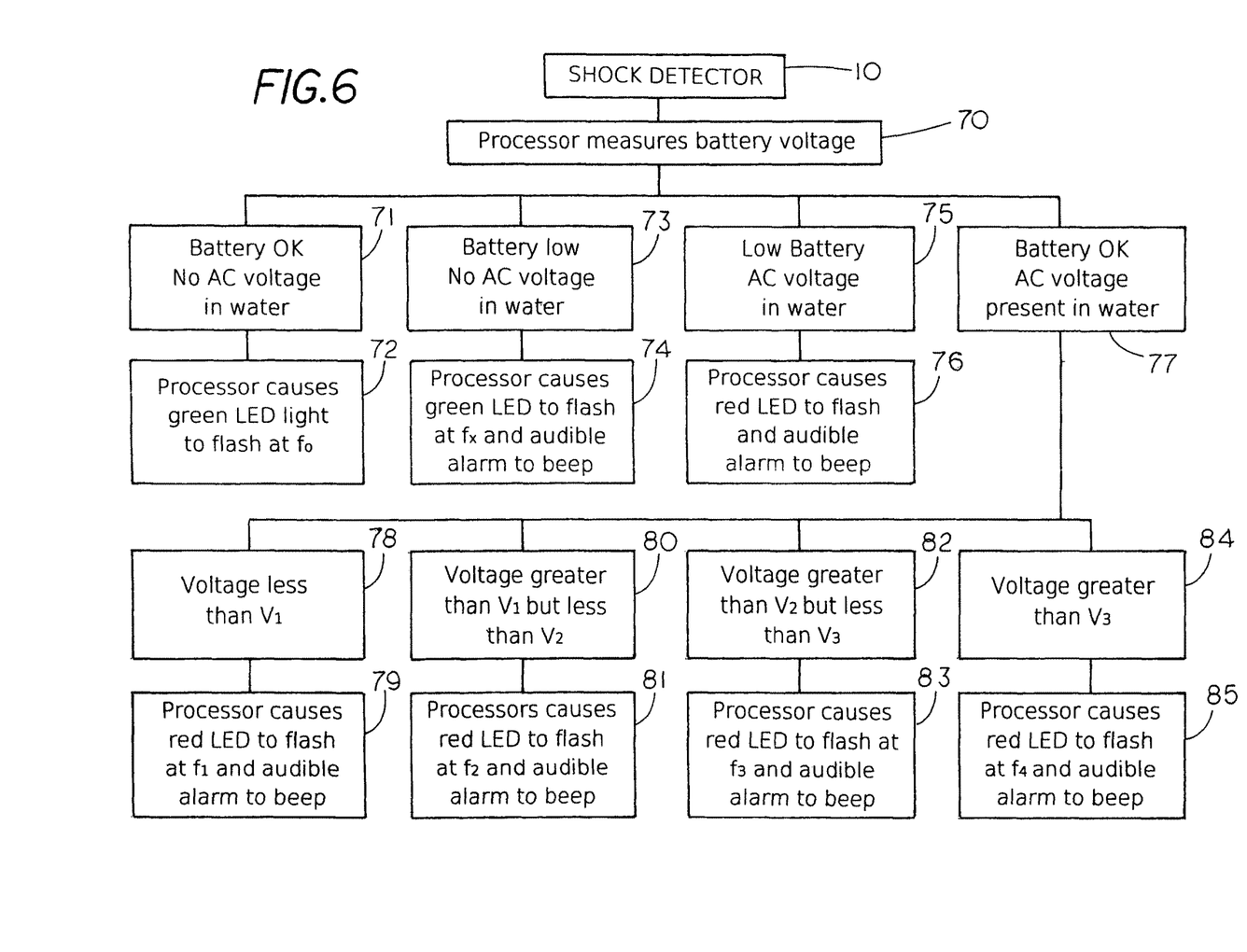
FIG. 6 is a flow chart of the shock detector illustrating the method of determining the presence and the amount of voltage in a body of water.

FIG. 6 is a flow chart of the operation of shock detector 10, which illustrates the method of determining the presence of water voltage as well as the level of the voltage gradient during four field conditions. FIG. 6 shows that during the voltage-measuring phase the processor begins by measuring the battery voltage (70). If the battery voltage is OK (above a preselected level) and there is no AC voltage in the body of water (71) the processor causes a green LED light to flash at a frequency $f_o$ (72).

If the battery voltage in the shock detector 10 is low (below a preselected level) and there is no AC voltage in the body of water (73) the processor causes the green LED light to flash at a frequency $f_x$ and an audible alarm to beep (74) where the frequency $f_x$ is different from the frequency $f_o$. In this mode the operator is alerted to replace the battery in the shock detector. Thus the shock detector through the type of signals alerts the observer that that there is no water voltage but in one case it alerts the observer that the battery in the shock detector should be replaced even though no AC voltage has been detected.

If the battery voltage in the shock detector is low (i.e. below a preselected level) (75) and there is AC voltage in the body of water the processor causes the red LED light to flash and an audible alarm to beep (76) thus alerting the person to the hazardous condition as well as the fact the battery is low and needs to be replaced.

If the battery voltage in the shock detector is OK (i.e. above a preselected voltage) and there exists an AC voltage in the body of water (77) the processor in the shock detector provides more information such as the level of AC voltage gradient in the body of water. In this example the processor provides an audible alarm as well as visual alarm signals, which are based on difference in frequency of the flashing of the Red LED light.

The processor also has the ability to determine different levels of voltage gradients and alert an operator not only to the existence of a water voltage and a voltage gradient but the level or strength of the voltage gradient. As shown in the FIG. 6 flow chart, if the processor determines that the water voltage gradient is less than a preselected water voltage gradient $V_1$ (78) the processor causes the Red LED light to flash at a frequency $f_1$ and the audible alarm to beep (79).

If the processor determines the water voltage gradient is greater than $V_1$ but less than $V_2$ where $V_1$ and $V_2$ are preselected water voltage gradients (80) the processor causes the red LED to flash at a frequency $f_2$ and the audible alarm to beep (81) where the frequency $f_2$ is different from $f_1$.

If the processor determines the water voltage gradient is greater than $V_2$ but less than $V_3$ where $V_3$ is a preselected water voltage gradient (82) the processor cause the red LED light to flash at a frequency $f_3$ and the audible alarm to beep (83) where the frequency $f_3$ is different from $f_2$ and $f_1$.

In the event the processor determines the voltage gradient in the body of water is greater than $V_3$ (84) the processor then cause the red LED light to flash at a frequency $f_4$ and the audible alarm to beep (85) where the frequency $f_4$ is different from $f_3$, $f_2$ and $f_1$.

Thus, a feature of the invention is that the shock detector 10 provides unique open water informational signals responsive to a range of voltage conditions to alert an operator to the water voltage danger in the body of water but also the level of the voltage gradient in the body of water. The feature of being able to send different signals for different voltages in the body allows the shock detector to become a diagnostic tool for locating the cause of the electrical short in open water by using the shock detector to locate where the voltage gradient in the body of water is the highest. That is by displacement or movement of the shock detector in the body of water one can determine where the voltage gradient is highest by the change in frequency of the flashing red LED light. By searching in the area where the shock detector measures the highest voltage gradient one limits the search area thus enabling one to more quickly find the problem causing voltage leak into the body of water.

Figure 7:
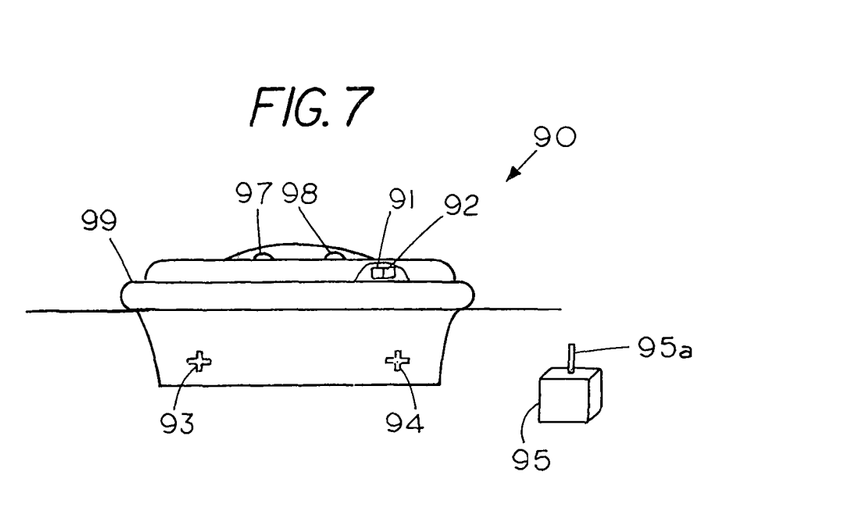
FIG. 7 shows a shock detector with a propulsion system.

FIG. 7 shows an example of a water propelled shock detector 90, which is identical to shock detector 10 except shock detector 90 includes means to move the shock detector from location to location in an open body of water. In this example shock detector 90 includes a first propeller 91 and a second propeller 94, an internal power source such as a battery and a radio-control 92 as typically used in powered model boats. A remote control box 95 and a joy stick 95a allows the operator to move the shock detector 90 to different locations in the body of water through control of the rotation of propellers 93 and 94 while the red LED light 97, the green LED light 98 and the beeper 99 provide information as to the presence of a voltage gradient but also the strength of the voltage gradient. Thus, the shock detector can be moved about in the body of open water without a person coming into contact with the body of water. Although, steering of the shock detector can be controlled by use of two propellers other methods of steering including a single pivoting propeller may be used without departing from the spirit and scope of the invention. Thus, with the use of a remote controller 95 an operator can remain on shore and away from contact with the water as the operator moves the shock detector 90 to various locations in the body of water, where the shock detector 90 can determine the existence as well as the strength of the voltage gradient. This feature of a remote controlled shock detector is not only useful in locating regions of high water voltage but is also useful in extending the range of the shock detector since the shock detector can be moved to a different location in the body of water to determine if there exists a harmful voltage gradient at a different location. That is, the shock detector typically has a useful range in determining a voltage gradient since the water voltage gradient decreases the further one is from the source of the electrical short. The decrease in water voltage gradient based on the distance from the electrical short is dependent on various factors including the salinity of the water. With the water propelled shock detector 90 one can move the shock detector about in the body of water to determine if harmful voltage gradients exist in other portion of the body of water. This feature is also useful in cases where the harmful water gradient is outside the normal range of the shock detector since one shock detector can be used to monitor harmful voltage gradients over an extended range by moving the shock detector from location to location. In other cases one may program the remote to direct the shock detector to automatically measure the voltage gradients at different locations in the body of water.

A further feature of shock detector 90 is a transmitter 91 that can send information on the harmful voltage gradient to a remote location. For example, the transmitter output may be in communication with an emergency squad, a power company or an entity that can respond if the shock detector determines a water voltage gradient has exceed a dangerous threshold that would injure or electrocute a person.

Figure 8:
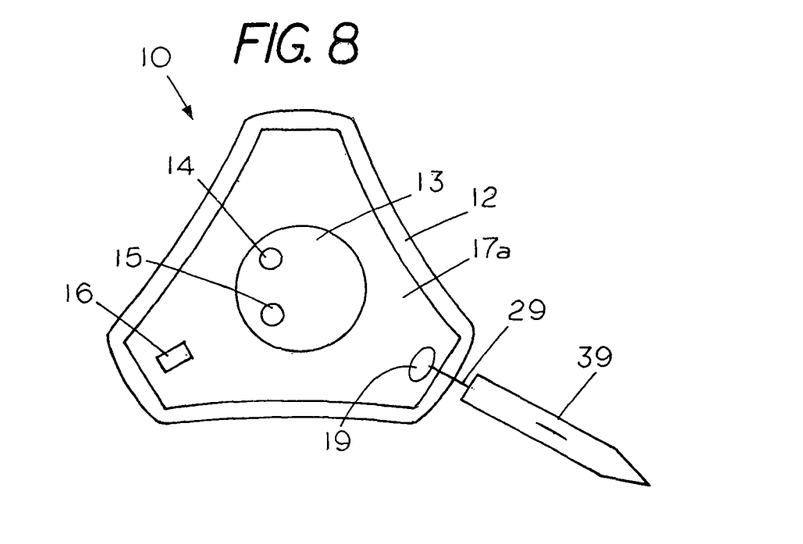
FIG. 8 shows the shock detector towed and controlled by a model boat.

FIG. 8 shows the shock detector 10 may be moved about in open water through the coupling of the shock detector 10 to a conventional remote controlled model power boat 39, which is attached to shock detector 10 by an electrically insulating cord 29. In this example, the model boat 39 and its remote control can be used to tow the shock detector 10 to various open water positions on the body of water.

One of the features of the invention is the use of electrically insulated cord 29, which is secured to the shock detector 10, to prevent a person from coming into contact with a harmful voltage gradient as a person places the shock detector into the body of water while holding on to the electrical insulated cord 29. Avoiding contact with the body of a water 8 during placement of the shock detector 10 in the body is a useful feature since it can prevent injury or harm to the person during the placement of the shock detector into the body of water in the event the water contains a harmful voltage gradient.

We claim:

1. An ungrounded battery powered shock detector comprising;
    a housing;
    a first water electrode for immersing in a body of water;
    a second water electrode for immersing in the body of water;
    a third water electrode for immersing in the body of water;
    a processer for measuring a voltage gradient between at least two of said water electrodes;
    an alarm for alerting a person to the existence of a harmful voltage gradient in the body of water where the harmful voltage gradient is such that it could injure or electrocute a person; and
    a battery in the housing with the alarm providing at least four different alarm signals with each alarm signal dependent on a voltage of the battery and the voltage gradient in the body of water.

2. The ungrounded battery powered shock detector of claim 1 where the shock detector is buoyant and self-righting as the shock detector floats in the body of water with of said water electrodes located on a bottom side of the shock detector and the alarm is located on a top side of the shock detector with each of said water electrodes in contact with the body of water as the battery powered shock detector floats in an upright position in the body of water.

3. The battery powered shock detector of claim 1 wherein the shock detector is a radio controlled shock detector with the radio controlled shock detector having at least one propeller for propelling the battery shock detector about in a body of water in response to a signal from a remote transmitter.

4. The battery powered shock detector of claim 1 wherein the shock detector provides an alarm signal dependent on the strength of the voltage gradient in the body of water.

5. The battery powered shock detector of claim 1 wherein after each alarm signal the processor measures the battery voltage to determine if the battery voltage is above an operating threshold.

6. The method of self-testing a battery powered shock detector having a battery, a battery powered green LED light and a battery powered red LED light comprising the steps of:
    measuring a battery voltage of the battery in the shock detector during an open circuit condition;
    measuring the battery voltage when the green LED light is on;
    measuring the battery voltage when the red LED light is on;
    activating the shock detector if the battery voltage is above a fail condition only if the battery voltage is above the fail condition when the green LED light is on, the battery voltage Is above the fail condition when the red LED light is on and the battery voltage is above the fail condition during an open circuit condition or stopping the battery powered shock detector from operating if the battery voltage is below the fail condition with the red LED light on, the battery voltage is below the fail condition with the green LED light on or the battery voltage is below the fail condition when measuring the battery voltage in the open circuit condition.

7. The method of claim 6 wherein the battery powered shock detector activates an audible alarm in response to the presence of a harmful voltage gradient in a body of water.

8. The method of claim 6 wherein the step of measuring the battery voltage during an open circuit condition is done at least once a second.

9. The method of claim 6 including measuring the battery voltage after the start of a flash of the green LED light but before a flash of the red LED light and measuring the battery voltage after the start of a flash of the red LED light.

10. The method of claim 6 where the green LED light flashes to indicate the shock detector does not detect a harmful voltage gradient in a body of water and the red LED light flashes to indicate the presence of harmful voltage gradient in a body of water.

11. A method of detecting a hazardous water condition with a battery powered voltage detector comprising the steps of:
   measuring a voltage of the battery and a voltage gradient in a body of water;
   providing a first signal if the battery voltage is low and there is no harmful voltage gradient in the body of water and providing a second signal if the battery voltage is low and there is a harmful voltage gradient in the body of water and providing a third signal if the battery voltage exceeds a safe level with the harmful voltage gradient in the body of water with the first signal the second signal and the third signal different from each other.

12. The method of claim 11 including the step of lowering the shock detector into the body of water with an electrically insulated cord secured thereto to prevent injuring a person in the event there is a harmful water gradient in the body of water.

13. The method of claim 11 including the step of providing a fourth signal if the harmful voltage gradient is less than $V_1$ when the battery voltage gradient exceeds the safe level where the forth signal is different from the first signal, the second signal and the third signal.

14. The method of claim 13 including the step of providing a fifth signal if the battery voltage exceeds the safe level and the harmful voltage gradient is greater than $V_1$ but less than $V_2$ where the fifth signal is different from the first signal, the second signal, the third signal and the fourth signal.

15. The method of claim 14 including the step of providing a sixth signal when the battery voltage exceeds the safe level and the harmful voltage gradient is greater than $V_2$ but less than $V_3$ where the sixth signal is different from the fifth signal, the fourth signal, the third signal, the second signal and the first signal.

16. The method of claim 15 including the step of providing a seventh signal when the battery voltage exceeds the safe level and the harmful water voltage gradient in the body of water is greater than $V_3$ where the seventh signal is different from the sixth signal, the fifth signal, the fourth signal, the third signal, the second signal and the first signal.

17. The method of claim 11 in moving the battery powered voltage detector from location to location in the body of water while using an alarm signal generated by the battery powered voltage detector to locate a source of the electrical fault in the body of water.

18. The method of claim 17 including propelling the battery powered voltage detector in the body of water with a remote controlled propeller.

19. The method claim 11 including the step transmitting an alarm signal from the shock detector to an onshore receiver.

20. The method of claim 11 including the step of attaching an anchor of the shock detector to limit the displacement of the shock detector as the shock detector measure the voltage gradient.

* * * * *